United States Patent [19]
Tsuno

[11] Patent Number: 6,140,645
[45] Date of Patent: Oct. 31, 2000

[54] TRANSMISSION ELECTRON MICROSCOPE HAVING ENERGY FILTER

[75] Inventor: Katsushige Tsuno, Tokyo, Japan

[73] Assignee: Jeol Ltd., Tokyo, Japan

[21] Appl. No.: 09/174,505

[22] Filed: Oct. 16, 1998

[30] Foreign Application Priority Data

Oct. 20, 1997 [JP] Japan ................................. 9-286474

[51] Int. Cl.[7] .............................. H01J 40/00; H01J 47/00; H01J 37/141
[52] U.S. Cl. ................... 250/311; 250/305; 250/396 ML
[58] Field of Search ................................. 250/311, 305, 250/396 ML

[56] References Cited

U.S. PATENT DOCUMENTS

| | | | |
|---|---|---|---|
| 4,740,704 | 4/1988 | Rose et al. | 250/396 ML |
| 4,760,261 | 7/1988 | Rose et al. | 250/396 ML |
| 5,097,126 | 3/1992 | Krivanek | 250/305 |
| 5,177,361 | 1/1993 | Krahl et al. | 250/305 |
| 5,448,063 | 9/1995 | De Jong et al. | 250/305 |
| 5,585,630 | 12/1996 | Taniguchi et al. | 250/305 |
| 6,040,576 | 3/2000 | Benner | 250/311 |

OTHER PUBLICATIONS

"Design and testing of Omega mode imaging energy filters at 200 kV", K. Tsuno et al., *Journal of Electron Microscopy*, 46(5), pp. 357–368 (1997).

*Primary Examiner*—Bruce C. Anderson
*Attorney, Agent, or Firm*—Webb Ziesenheim Logsdon Orkin & Hanson, P.C.

[57] ABSTRACT

There is disclosed a small-sized and inexpensive electron spectroscopic imaging (ESI) system using an Ω-filter. The amounts of currents supplied to the lenses located before and after the Ω-filter need not be varied, whether the Ω-filter is used or not. The Ω-filter has an entrance window and an exit window. A straight path is formed between these two windows. A coil in an objective lens is located above a specimen. An entrance aperture is positioned close to the back focal plane of the objective lens. The objective lens is so energized that an electron microscope image is focused at the center of the filter on the straight path. The first stage of imaging lens is so energized that an image at the position P is an object plane. This image is magnified and focused onto a fluorescent screen by the following stages of imaging lenses.

9 Claims, 2 Drawing Sheets

TRANSMISSION ELECTRON MICROSCOPE HAVING ENERGY FILTER

FIELD OF THE INVENTION

The present invention relates to a transmission electron microscope equipped with an energy analyzer such as an Ω-filter.

DESCRIPTION OF THE PRIOR ART

In recent years, instruments in which an energy filter is placed behind the objective lens of a transmission electron microscope have enjoyed wide acceptance. An instrument of this kind is known as an apparatus equipped with an electron spectroscopic imaging (ESI) system. Various types of energy filters are available. An instrument using an Ω-filter or a-filter belongs to an in-column energy filter in which a filter is inserted in an intermediate position within the microscope column of a transmission electron microscope, because the optical axis of the beam incident on the energy filter is in line with the optical axis of the beam going out of the filter.

FIG. 3 schematically shows an in-column ESI system using an Ω-filter. This system comprises an objective lens 1 (designated OL), a yoke 2, a coil 3, intermediate lenses 5, 6 and 7 (designated IL), the Ω-filter 8, an entrance aperture 9, an exit slit 10 and imaging lenses 11, 12 and 13. A specimen 4 is placed within the yoke 2.

An electron beam emitted from an electron gun (not shown) is focused by a condenser lens (not shown) and directed at the specimen 4 through the objective lens 1. The specimen 4 is placed within the yoke 2 of the objective lens 1 as mentioned above. The coil 3 is wound under the specimen 4 and inside the yoke 2. A diffraction pattern of the specimen 4 is created at the position of the back focal plane of the objective lens 1 just under the specimen 4. An electron microscope image (hereinafter referred to as EM image) is also created at a given position.

With the structure shown in FIG. 3, an EM image attributed to an electron beam having a certain range of energies passed through the Ω-filter 8 can be observed. This mode of operation is referred to as the image mode. Furthermore, it is possible to obtain a diffraction pattern owing to the electron beam having the certain range of energies passed through the Ω-filter 8. This mode of operation is referred to as the diffraction mode. In these modes, it is necessary to create the EM image and the diffraction pattern at their respective given positions in the Ω-filter 8. In the image mode, the diffraction pattern needs to be created in the position of the entrance aperture 9 located immediately before the entrance window of the Ω-filter 8, while the EM image needs to be created in the given position A inside the Ω-filter 8. In the diffraction mode, it is necessary that the EM image be created at the position of the entrance aperture 9 of the Ω-filter 8 and that the diffraction pattern be created at the position A inside the filter 8.

Namely, the EM image and the diffraction pattern are focused at different positions, depending on whether the mode of operation is the image mode or the diffraction mode. To focus the diffraction pattern or the EM image at the position of the entrance aperture 9, three stages of intermediate lenses 5, 6 and 7 are mounted. In the image mode, these lenses 5–7 are energized to bring the diffraction pattern formed in the back focal plane of the objective lens 1 into focus at the position of the entrance aperture 9 and to bring the EM image into focus at the position A inside the Ω-filter 8. In the diffraction mode, the lenses 5–7 are so energized that the diffraction pattern created in the back focal plane of the objective lens 1 is brought into focus at the position A inside the Ω-filter 8 and that the EM image is brought into focus at the position of the entrance aperture 9.

In the image mode, the diffraction pattern formed at the position of the entrance aperture 9 is brought into focus at the position of the exit slit 10 by the action of the Ω-filter 8, the exit slit 10 being positioned immediately behind the exit window of the filter 8. The EM image created at the position A is brought into focus at the position B by the action of the Ω-filter 8. The positions A and B are symmetrical with respect to the center O of the Ω-filter 8. Similarly, the entrance aperture 9 and the exit slit 10 are arranged symmetrically with respect to the center O of the Ω-filter 8.

The EM image focused at the position B in the Ω-filter 8 is magnified and focused onto a fluorescent screen or photographic film (not shown in FIG. 3) by the three stages of imaging lenses 11, 12 and 13. That is, the first stage of imaging lens 11 takes the image at the position B inside the Ω-filter 8 as an object plane.

The same principle applies to the diffraction mode. In this mode, the EM image created at the position of the entrance aperture 9 is brought into focus at the position of the exit slit 10 by the action of the Ω-filter 8, the exit slit 10 being located immediately behind the exit window of the Ω-filter 8. The diffraction pattern created in the position A is brought into focus at the position B by the action of the Ω-filter 8. The diffraction pattern focused at the position B in the Ω-filter 8 is magnified and focused onto the fluorescent screen or photographic film by the three stages of imaging lenses 11, 12 and 13.

Usually, the Ω-filter 8 is composed of plural magnets. Since the shapes of the individual magnets and their arrangement per se are not essential to the present invention, the Ω-filter 8 is shown to consist of one magnet in FIG. 3.

With the ESI system constructed as shown in FIG. 3, EM images and diffraction patterns owing to the electron beam passed through the Ω-filter 8 are obtained. In addition, it may be required that an EM image or diffraction pattern owing to an electron beam just passed through the specimen 4 (i.e., when the Ω-filter 8 is not in operation and hence the beam is not acted on by the filter 8) be created. For this purpose, deenergization of the Ω-filter 8 of the construction shown in FIG. 3 may be contemplated. However, this is difficult to achieve, because the intermediate lenses 5, 6 and 7 or the imaging lenses 11, 12 and 13 are energized with currents that are greatly different according to the mode of operation.

It is now assumed that an EM image is observed (i.e., the instrument is in the image mode). If an EM image created by the electron beam passed through the Ω-filter 8 is to be observed, the intermediate lenses 5, 6 and 7 are so energized that the EM image focused by the objective lens 1 is brought into focus at the position A inside the Ω-filter 8. The first stage of imaging lens 11 is so energized that an image located in the position B inside the Ω-filter 8 forms an object plane. However, if the Ω-filter 8 is shifted laterally off the optical axis from the condition of FIG. 3, and if the operator wants to observe an EM image created by the electron beam passed through the specimen 4, the excitation current supplied to the first stage of imaging lens 11 must be varied so that the position A forms an object plane, provided that the amounts of excitation currents supplied to the intermediate lenses 5, 6 and 7 remain the same. Furthermore, the excitation currents supplied to the following stages of imaging lenses 12 and 13 must be varied to magnify the image created by the imaging lens 11 by a given factor and to focus the image onto the fluorescent screen or photographic film.

Conversely, if the amounts of excitation currents supplied to the imaging lenses 11, 12 and 13 are not varied, the amounts of currents supplied to the intermediate lenses 5, 6 and 7 must be changed so that the EM image focused by the objective lens 1 is brought to focus at the position B.

It is cumbersome to change the currents supplied to various lenses (i.e., the intermediate lenses 5, 6 and 7 or the imaging lenses 11, 12 and 13) according to whether an EM image or a diffraction pattern owing to an electron beam passed through the Ω-filter 8 is observed or an EM image or a diffraction pattern created by an electron beam simply passed through the specimen 4 is observed as described above.

The instrument shown in FIG. 3 is too large and expensive according to the purpose. In particular, where crystalline materials are observed, observation of EM images is important, as well as observation of diffraction patterns. Consequently, the three stages of intermediate lenses 5, 6, and 7 are indispensable components. However, where cells of a living organism are observed, only EM images are taken; no diffraction patterns are taken. Hence, the three stages of intermediate lenses 5, 6 and 7 shown in FIG. 3 are used at only one setting in biological applications and so this structure is wasteful. In addition, the instrument has many stages of lenses, i.e., the three intermediate lenses and the three imaging lenses behind the objective lens 1. This renders the instrument bulky.

SUMMARY OF THE INVENTION

In view of the foregoing problems, the present invention has been made.

It is an object of the present invention to provide an ESI (electron spectroscopic imaging) system which is smaller and cheaper than conventional applications where only EM images are necessary and in which the amounts of currents supplied to lenses located before and after an energy filter are kept constant, whether the energy filter is used or not.

A transmission electron microscope equipped with an energy filter in accordance with the present application has an entrance aperture located immediately before the energy filter that is positioned between an objective lens and imaging lenses. The entrance aperture is located close to the back focal plane of the objective lens.

This energy filter has a center plane about which the entrance window and the exit window are symmetrical. When the incident beam is brought to focus on the plane of the aperture, a plane connecting the first and final virtual images of an EM image in the energy filter is preferably coincident with the center plane. The objective lens is preferably composed of a yoke and a coil wound inside the yoke. This coil can be located only on the side of the electron gun above the specimen. Furthermore, it is desired to place four stages of imaging lenses behind the energy filter.

In a transmission electron microscope equipped with an energy filter in accordance with another embodiment of the present application, the energy filter is located between an objective lens and imaging lenses. This energy filter has a center plane about which an entrance window and an exit window are symmetrical. When an incident beam is focused onto the plane of the aperture, a plane connecting the first and final virtual images of an EM image inside the energy filter is coincident with the center plane. Preferably, the final stage of lens on the upstream side of the energy filter is so energized that the virtual images are focused on the central plane. The foremost lens on the downstream side of the energy filter is so energized that the virtual images on the center plane form an object plane.

In a transmission electron microscope equipped with an energy filter in accordance with yet another embodiment of the present application, the energy filter is located between an objective lens and imaging lenses, the energy filter having a center plane about which an entrance window and an exit window are symmetrical. When an incident beam is focused onto the plane of an aperture, a plane connecting the first and final virtual images of an EM image inside the energy filter is coincident with the center plane. There are provided four stages of imaging lenses. The first stage of these imaging lenses is so energized that an image focused onto the center plane forms an object plane.

A complete understanding of the invention will be obtained from the following description when taken in connection with the accompanying drawing figures wherein like reference characters identify like parts throughout.

Other objects and features of the invention will appear in the course of the description thereof, which follows.

DETAILED DESCRIPTION OF THE INVENTION

Figure 1:
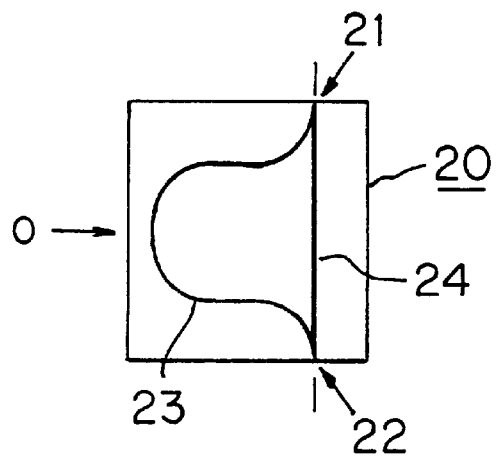
FIG. 1 is a diagram showing an Ω-filter in accordance with the present invention.

Referring to FIG. 1, an Ω-filter 20 has an entrance window 21, an exit window 22, an ordinary Ω-shaped path 23 and a straight path 24. The center of this filter 20 is indicated by O, in the same way as in FIG. 3.

The ordinary Ω-shaped path 23 and the straight path 24 are formed between the entrance window 21 and the exit window 22 of this Ω-filter 20. When this Ω-filter 20 is used, an electron beam travels in the Ω-shaped path 23, which is similar to the Ω-shaped electron beam path formed in an ordinary Ω-filter. The straight path 24 is a hole straightly connecting the entrance window 21 and the exit window 22 of this Ω-filter 20. When this Ω-filter 20 is not used (i.e., the Ω-filter 20 is not energized), the electron beam passes through this straight path 24.

When the diffraction pattern is focused onto the entrance aperture plane, the plane onto which virtual images of the EM image inside the filter are focused can be brought into agreement with the center plane of the filter by devising the design of the filter geometry. An example of this is given in FIG. 4. When the filter is in operation and out of operation, imaging takes place in the manner described below.

Figure 4:
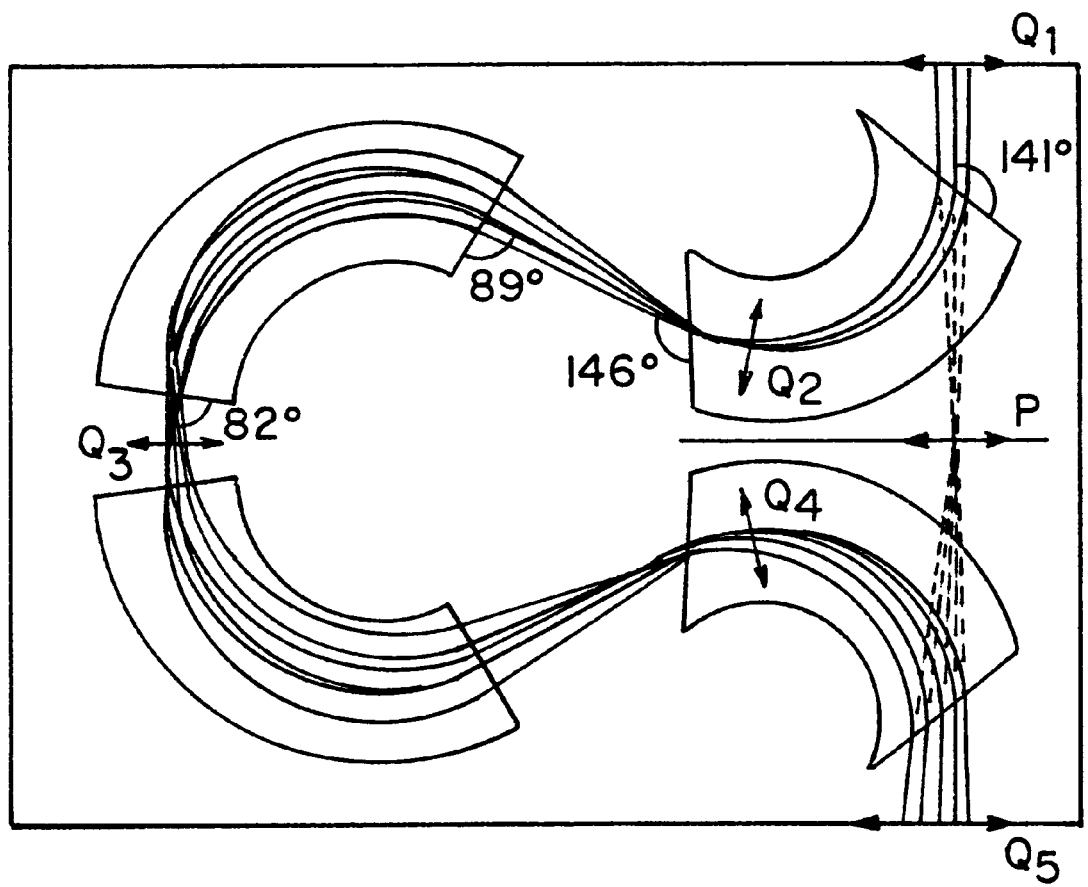
FIG. 4 is a diagram showing the Ω-filter of FIG. 2 more particularly.

When the filter is in operation, an electron beam incident on the filter first creates a focused real image of an EM image at $Q_2$ under conditions where a diffraction pattern is brought to focus at the entrance aperture plane $Q_1$, as shown in FIG. 4. Then, a real image is again created at the center plane $Q_3$ of the filter and a real image is created at $Q_4$. The EM image at this point, $Q_4$ is magnified by the following stage of imaging lenses and projected onto a fluorescent screen or photographic film. At this time, the incident beam forms a focused virtual image at the center plane P. This is referred to as an entrance pupil. This virtual image corresponds to the real image of the EM image at $Q_2$.

Furthermore, a virtual image corresponding to the EM image at $Q_4$ is focused at the center plane P. This is referred to as an exit pupil. Eventually, the entrance and exit pupils are coincident in position in this filter and lie at the center plane P.

When the filter is not in operation, the electron beam incident on the filter under the same conditions is focused into a real image at the center plane P. This image is directly magnified and projected onto the fluorescent screen or photographic film by the following stage of imaging lenses. That is, when the filter is brought out of operation, it is not necessary at all to adjust the following stage of imaging lenses.

The Ω-filter shown in FIG. 4 is designed as follows. Let z be the optical axis of the electron beam passing through the filter. A direction perpendicular to the optical axis z and parallel to the plane of the magnetic poles is indicated by x. A direction perpendicular to the optical axis z of the electron beam and to the plane of the magnetic poles is indicated by y. Where the electron beam is focused and entered through the entrance window of the filter, the beam must be focused in both x- and y-directions at the exit window of the filter and at the exit-side image plane corresponding to position $Q_4$ in FIG. 4. These four focusing operations are achieved by varying the angles that the entrance end surfaces and the exit end surfaces of the four magnets forming the Ω-filter make to the optical axis z. There are eight end surfaces. Since the beam entering the filter and the beam going out of it must be symmetrical with respect to a plane, the number of degrees of freedom is four. The aforementioned four focusing operations can be achieved by appropriately varying the angles that the end surfaces with four degrees of freedom make to the optical axis z, irrespective of how the image plane on the exit side (i.e., the corresponding pupil plane) is established. Accordingly, the pupil plane of the virtual image is brought to the center plane about which the incident and outgoing beams are symmetrical. The four angles are appropriately varied. The values of the four angles at which the four focusing conditions are satisfied are searched and determined.

Figure 2:
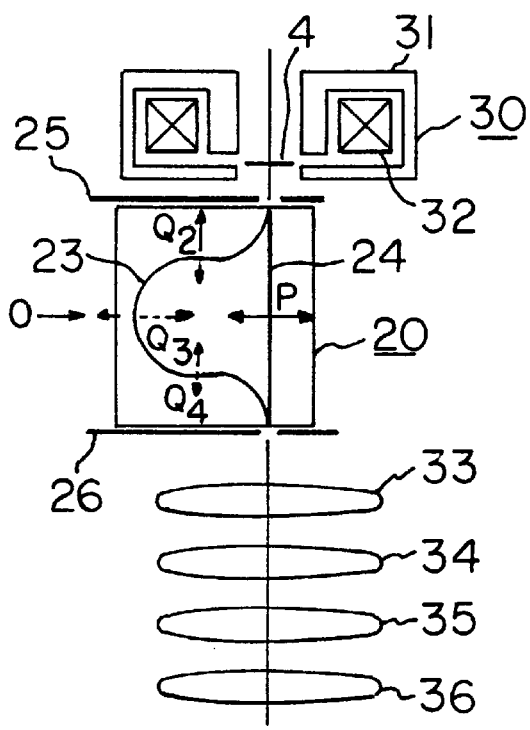
FIG. 2 is a diagram showing a transmission electron microscope equipped with an Ω-filter shown in FIG. 4, the filter being built in accordance with the invention.

An example of the ESI system using the Ω-filter 20 shown in FIG. 4 is presented in FIG. 2. This Ω-filter 20 has an Ω-shaped path 23, a straight path 24, an entrance aperture 25 and an exit aperture 26. An objective lens 30 has a yoke 31 and a coil 32. Imaging lenses 33, 34, 35 and 36 are mounted near the Ω-filter 20. A specimen 4 is placed inside the yoke 31.

Figure 3:
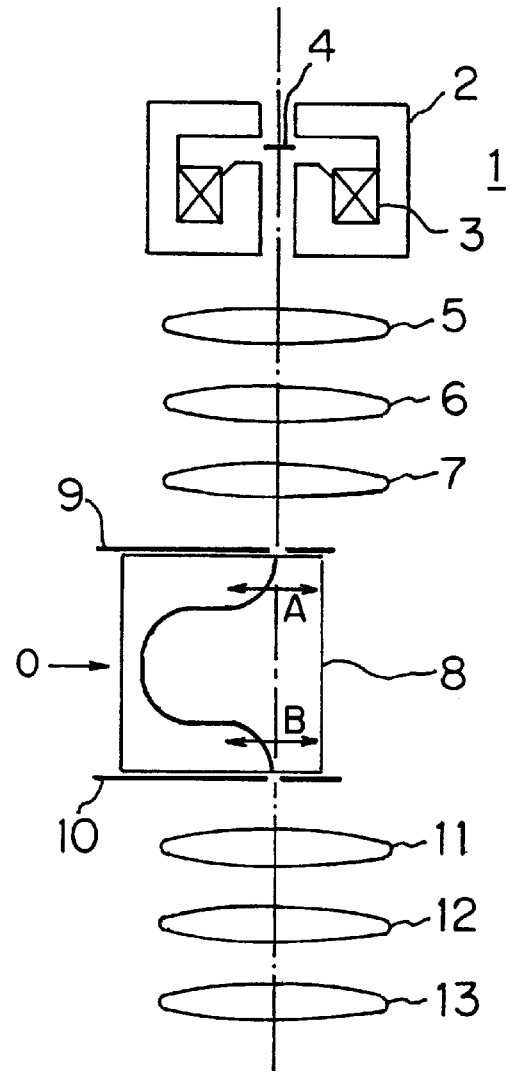
FIG. 3 is a schematic diagram of the prior art in-column ESI system using an Ω-filter.

The structure shown in FIG. 2 and the structure shown in FIG. 3 differ in objective lens construction. In the structure shown in FIG. 2, the objective lens 30 consists of the yoke 31 and the coil 32 wound inside the yoke 31. The coil 32 is located above the specimen 4, i.e., placed closer to the electron gun (not shown in FIG. 2) than the specimen 4. This permits the Ω-filter 20 to be positioned immediately under the objective lens 30, as shown in FIG. 2. Hence, the intermediate lenses 5, 6 and 7 shown in FIG. 3 can be omitted. The entrance aperture 25 located immediately before the entrance window of the Ω-filter 20 is close to the back focal plane of the objective lens 30. The objective lens 30 is so energized that an EM image of the specimen 4 is always brought to focus at position P in FIG. 2, i.e., the center O of the Ω-filter 20 lying on the straight path 24.

The structure of the objective lens 30 is not limited to the structure shown in FIG. 2. Any other structure may be adopted as long as the entrance aperture 25 of the Ω-filter 20 can be placed close to the back focal plane of the objective lens and the EM image of the specimen 4 can be always brought to focus at the position of the center O of the Ω-filter 20.

When the Ω-filter 20 is deenergized, the EM image focused at the position P is directly magnified by the following stages of imaging lenses 34, 35 and 36 and focused onto a fluorescent screen or photographic film (not shown in FIG. 2).

When the Ω-filter 20 is energized, the electron beam passes through the Ω-shaped path 23. The virtual image of the EM image focused at $Q_2$ on the Ω-shaped path 23 is at the position P. Also, a virtual image as viewed from the side of the imaging lens 33 that is focused at $Q_4$ lies at the position P. Therefore, the virtual image at this position P is magnified and projected by the imaging lenses 33–36.

In the structure described above, the straight path 24 consisting of a hole straightly connecting the entrance and exit windows is formed in the Ω-filter 20. The EM image is brought to focus at the position P that is the center O of the Ω-filter 20 on the straight path 24, whether the Ω-filter 20 is used or not. It is only necessary that the position P be an object plane for the first stage of imaging lens 33, the amount of current supplied to it needs not be varied.

In FIG. 2, when an EM image created by the electron beam passed through the Ω-filter 20 is observed, an EM image owing to the objective lens 30 can be regarded as being focused at the position P (FIG. 2) at all times, whether the Ω-filter 20 is used or not. This image is magnified and projected by the imaging lenses 33–36.

Bringing the image into focus at the center O of the Ω-filter 20 on the straight path 24 is advantageous to the structure of FIG. 2. Also, placing the object plane of the first stage of imaging lens at the center O of the Ω-filter 20 on the straight path 24 is advantageous to the structure shown in FIG. 2. Furthermore, this arrangement is advantageous to the prior art structure of FIG. 3 using the Ω-filter shown in FIG. 1, because it is not necessary to modify the amount of current supplied to the first stage of imaging lens, whether the Ω-filter is energized or deenergized, at least in the image mode, for the reason described above.

In FIG. 2, four stages of imaging lenses 33–36 are mounted to satisfy all the functions of the electron microscope. That is, in the image mode, the magnification must be varied without rotating the image. Any arbitrary image must be rotated. The magnification must be varied over a wide range. In this way, various functions are required. To achieve these requirements, at least three stages of lenses that can be energized with varying amounts of currents are necessary.

The functions described above cannot fully be achieved if the structure shown in FIG. 2 is equipped with three stages of imaging lenses, because the amount of current supplied to the first stage of imaging lens 33, whose object plane must be at the position P in FIG. 2, cannot be varied at will.

Accordingly, four stages of imaging lenses 33–36 are mounted. The first stage of imaging lens 33 is so energized that the position P shown in FIG. 2 forms an object plane. The following stages of imaging lenses 33–36 are energized with currents that can be varied at will. In this way, the aforementioned various requirements are met.

As described above, in the structure shown in FIG. 2, no physical movement is necessary, whether the Ω-filter 20 is used or not. When it is used, the Ω-filter 20 is energized. When it is not used, it is deenergized. Furthermore, it is not necessary to place any intermediate lens between the objective lens and the Ω-filter as in the conventional configuration shown in FIG. 3, because the Ω-filter 20 can be positioned immediately under the objective lens 30. Moreover, the amount of excitation current supplied to the Ω-filter 20 needs not be varied, whether it is used or not, since the position P shown in FIG. 2 is taken as an object plane for the first stage of imaging lens 33. There are provided four stages of imaging lenses. Hence, various requirements can all be catered for. For example, the magnification can be varied without rotating the image. Any desired image can be rotated. The magnification can be varied over a wide range. In the prior art geometry shown in FIG. 3, six stages of lenses (i.e., three intermediate lenses and three imaging lenses) are necessary. In the configuration shown in FIG. 2, only four stages of imaging lenses are required. Consequently, the whole instrument can be made smaller. Further, the invention can be applied to energy filters other than Ω-filters.

Having thus described my invention with the detail and particularity required by the Patent Laws, what is desired protected by Letters Patent is set forth in the following claims.

What is claimed is:

1. A transmission electron microscope comprising:

an objective lens having a back focal plane;

imaging lenses;

an energy filter inserted between the objective lens and the imaging lenses and having an entrance window; and an aperture located in a plane and placed close to said entrance window of said energy filter and to the back focal plane of said objective lens.

2. The transmission electron microscope of claim 1, wherein said energy filter has a center plane about which said entrance window and an exit window are symmetrical, and wherein when an incident beam is brought to focus upon the plane of said aperture, a plane connecting first and final virtual images of an electron microscope image inside said energy filter is coincident with said center plane.

3. The transmission electron microscope of claim 2, wherein said imaging lenses are four stages of imaging lens located behind said energy filter.

4. The transmission electron microscope of any one of claims 1–3, wherein said objective lens consists of a yoke and a coil wound inside the yoke, and wherein said coil is positioned only at a side of an electron gun above a specimen.

5. A transmission electron microscope comprising:

an objective lens;

imaging lenses;

an energy filter inserted between the objective lens and the imaging lenses and having an entrance window and an exit window, said energy filter having a center plane about which said entrance window and said exit window are symmetrical, said entrance window being located in a plane; and wherein when an incident beam is brought to focus upon the plane of said entrance window, a plane connecting first and final virtual images of an electron microscope image inside said energy filter is coincident with said center plane.

6. The transmission electron microscope of claim 5, wherein a final lens upstream of said energy filter is so energized that a virtual image of said electron microscope image is focused upon said center plane of said energy filter.

7. The transmission electron microscope of claim 6, wherein a foremost lens downstream of said energy filter is so energized that a virtual image upon said center plane of said energy filter is an object plane.

8. The transmission electron microscope of claim 7, wherein said imaging lenses are four stages of imaging lenses located behind said energy filter.

9. A transmission electron microscope comprising:

an objective lens;

four stages of imaging lenses including a first stage of imaging lens;

an energy filter inserted between the objective lens and the imaging lenses and having an entrance window and an exit window, said energy filter having a center plane about which said entrance window and said exit window are symmetrical, said entrance window being located in a plane; and wherein when an incident beam is brought to focus upon the plane of said entrance window, a plane connecting first and final virtual images of an electron microscope image inside said energy filter is coincident with said center plane, and wherein said first stage of imaging lens is so energized that an image focused at said center plane is an object plane.

* * * * *